United States Patent [19]

Takeda

[11] Patent Number: 5,053,312

[45] Date of Patent: Oct. 1, 1991

[54] IMAGE-RECEIVING MATERIAL AND IMAGE-FORMING METHOD EMPLOYING THE SAME

[75] Inventor: Keiji Takeda, Kanagawa, Japan

[73] Assignee: Fuji Photo Film Co., Ltd., Kanagawa, Japan

[21] Appl. No.: 282,780

[22] Filed: Dec. 12, 1988

[30] Foreign Application Priority Data

Dec. 11, 1987 [JP] Japan ................................. 62-313483
Dec. 11, 1987 [JP] Japan ................................. 62-313484

[51] Int. Cl.$^5$ .......................... G03C 1/06; G03F 7/029
[52] U.S. Cl. ..................................... 430/254; 430/753; 430/755; 430/232; 430/211
[58] Field of Search ............... 430/138, 211, 253, 255, 430/254, 232

[56] References Cited

U.S. PATENT DOCUMENTS

| | | | |
|---|---|---|---|
| 2,584,030 | 1/1952 | Land | 430/232 |
| 3,811,924 | 5/1974 | Gallagher et al. | |
| 4,357,418 | 11/1982 | Cellone | |
| 4,399,209 | 8/1983 | Sanders et al. | 430/138 |
| 4,629,676 | 12/1986 | Hayakaua et al. | 430/203 |
| 4,734,354 | 3/1988 | Takagi | 430/232 |
| 4,764,451 | 8/1988 | Ishikawa et al. | 430/138 |
| 4,800,148 | 1/1989 | Harada et al. | 430/138 |

OTHER PUBLICATIONS

Abstract of Japanese Pat. Prov'l Publ'n No. 62(1987)-117794.

*Primary Examiner*—Marion E. McCamish
*Assistant Examiner*—Christopher D. RoDee
*Attorney, Agent, or Firm*—Sughrue, Mion, Zinn Macpeak & Seas

[57] ABSTRACT

Disclosed are an image-receiving material comprising a support and an image-receiving layer provided thereon which contains a developer and a binder polymer mixture composed of at least two kinds of water-soluble polymers which undergo phase separation in the mixed state. This image-receiving material is advantageously employed in an image-forming method which comprises the steps of imagewise exposing to light a light-sensitive material comprising a support and a light-sensitive layer containing silver halide, a reducing agent, and an ethylenically unsaturated polymerizable compound; simultaneously or thereafter developing the light-sensitive material; and pressing the light-sensitive material on the image-receiving material to transfer the unpolymerized polymerizable compound to the image-receiving layer.

6 Claims, No Drawings

IMAGE-RECEIVING MATERIAL AND IMAGE-FORMING METHOD EMPLOYING THE SAME

FIELD OF THE INVENTION

This invention relates to an image-receiving material comprising a support and an image-receiving layer provided thereon, and to an image-forming method employing the image-receiving material.

BACKGROUND OF THE INVENTION

An image-receiving material is employable in an image-forming method utilizing a light-sensitive material which comprises a support and a light-sensitive layer containing an ethylenically unsaturated polymerizable compound. The image-forming method comprises the steps of imagewise polymerizing the polymerizable compound of the light-sensitive material and transferring an unpolymerized polymerizable compound from the light-sensitive material to the image-receiving material.

Examples of the image-forming methods are described in Japanese Patent Provisional Publications Nos. 57(1982)-179836, 58(1983)-88739, 58(1983)-88740 (corresponding to U.S. Pat. No. 4,440,846), 59(1984)-30537, 59(1984)-137944 (corresponding to U.S. Pat. No. 4,483,912) and 60(1985)-259490 (corresponding to U.S. Pat. No. 4,554,235).

Recently, it has been found that the image-receiving materials can be advantageously used for another image-forming method employing silver halide as photosensor. The image-forming method is described in Japanese Patent Provisional Publications Nos. 61(1986)-69062, 61(1986)-731456 (the contents of both publication are described in U.S. Pat. No. 4,629,676 and European Patent Provisional Publication No. 0174634A2), 61(1986)-275742 and 61(1986)-278849 (the contents of both publication European Patent Provisional Publication No. 0203613A). The image-forming method comprises the steps of: imagewise exposing to light a light-sensitive material comprising a support and a light-sensitive layer containing silver halide, a reducing agent and a polymerizable compound; simultaneously or thereafter developing the light-sensitive material; and pressing the light-sensitive material on the image-receiving material to transfer the unpolymerized polymerizable compound to the image-receiving layer.

The image-forming method employing an image-receiving material and a light-sensitive material in which silver halide is utilized as photosensor is described in Japanese Patent Provisional Publication Nos. 62(1987)-210444 and 62(1987)-209454.

As for the image-receiving material used in the above methods, various materials have been proposed according to purposes. For example, an image-receiving material (heat-sensitive transferring medium) described in Japanese Patent Provisional Publication No. 62(1987)-117794 contains zinc chloride in the specifically determined amount based on the amount of a developer. It is reported that in the case of using this image-receiving material, the resulting transferred image hardly fades or disappears even by using an organic solvent or a plasticizer.

SUMMARY OF THE INVENTION

An object of the present invention is to provide an image-receiving material which gives an image of high density.

Another object of the invention is to provide an image-forming method employing the above image-receiving material.

There is provided by the present invention an image-receiving material comprising a support and an image-receiving layer provided thereon which comprises a developer and a binder polymer, wherein said binder polymer comprises at least two kinds of water-soluble polymers which undergo phase separation in their mixed state.

There is further provided by the present invention an image-forming method which comprises:

imagewise exposing to light a light-sensitive material comprising a support and a light-sensitive layer provided thereon which contains silver halide, a reducing agent, an ethylenically unsaturated polymerizable compound and a color image-forming substance;

simultaneously or thereafter developing the light-sensitive material; and pressing the light-sensitive material on any of the above-mentioned image-receiving material which comprises a support and an image-receiving layer provided thereon comprising a developer and a binder polymer, wherein said binder polymer comprises at least two kinds of water-soluble polymers which undergo phase separation in their mixed state, to transfer the unpolymerized polymerizable compound to the image-receiving layer of the image-receiving material.

In the image-receiving material of the invention, a binder polymer contained in the image-receiving layer is composed of at least two kinds of water-soluble polymers which undergo (bring about) phase separation in the mixed state. When the image-forming method is performed using such image-receiving material, an image of high density can be obtained.

According to studies of the present inventor, it has been found that the density of an image obtained in an image-receiving layer can be increased in proportion to the increase of the void ratio of the image-receiving layer. Also found is that the increase of the void ratio of the image-receiving layer can be attained by the use of the above-mentioned specific combination of water-soluble polymers as a binder polymer of the image-receiving layer.

The image-receiving layer is generally formed by preparing a coating solution containing the above-described components, coating the solution on a support and drying the coated layer. When a combination of components which are poorly miscible with each other is employed as a binder polymer, a phenomenon of phase separation (or agglomeration) occurs. In the case of forming an image-receiving layer using such coating solution, dense solidification hardly takes place within the image-receiving layer in the course of coating and drying procedure. As a result, the resulting image-receiving layer has higher void ratio (void volume) as compared with an image-receiving layer formed using a single polymer or a combination of plural polymers which are well miscible with each other.

In the use of the image-receiving material of the, invention, it is assumed that the unpolymerized polymerizable compound (i.e., viscous oily material containing a color image forming substance) of the light-sensitive material is easily absorbed by the image-receiving layer of the image-receiving material, and a high transferring efficiency can be accomplished in the image-forming stage. Thus, the employment of the image-receiving material of the present invention makes it possible to increase yield of a color image forming substance received on the image receiving material, and thereby an image of higher density can be obtained on the image-receiving material.

DETAILED DESCRIPTION OF THE INVENTION

One of the image-receiving materials of the present invention is described below in detail.

The image-receiving material comprises a support and an image-receiving layer provided thereon which contains a developer and a binder polymer, and the binder polymer comprises at least two kinds of water-soluble polymers which undergo phase separation.

The occurrence of phase separation can be confirmed, for example, in the following manner.

Two grams of an aqueous dispersion of 1 g of zinc 3,5-di-α-methylbenzyl salicylate having a mean particle size of 1 to 5 μm in 10 g of water are mixed with an aqueous mixture prepared by mixing each 0.5 g of 10 wt. % aqueous solution of each water-soluble polymer and 2 g of water in a test tube. The resulting mixture is allowed to stand for 24 hours. If the resulting mixture is phase-separated (sometimes with agglomeration) into two layers, it can be mentioned that the combination of the tried two water-soluble polymers undergoes phase separation. The condition of those two layers differs depending on the combination of the employed water-soluble polymers, but generally the upper layer is transparent or translucent and the lower layer is opaque.

The image-receiving layer may contain two or more sets of the above-described two kinds of polymers.

The mixing ratio between the two kinds of polymers is preferably in the range of 0.1:10 to 10:0.1, by weight, more preferably 1:10 to 10:1, by weight.

There is no specific limitation on the binder polymers employable in the invention provided that a combination of these polymers satisfies the above-mentioned condition.

Examples of the water-soluble polymers include proteinous polymers such as gelatin, non-proteinous natural polymers such as carboxymethyl cellulose, methyl cellulose, gum arabic and pectin, and synthetic polymers such as polyvinyl alcohol, polyvinyl pyrrolidone, polyacrylic acid, sodium salts thereof, polystyrene sodium sulfonate, polyethyleneimine and polyethylene oxide.

Preferred combinations as the binder polymer are polyvinyl alcohol and gelatin and polyvinyl pyrrolidone and gelatin. In this case, gelatin is preferably used in an amount of 3 to 90 wt. %, more preferably 10 to 70 wt. %, based on the whole amount of the binder polymer.

The binder polymer is preferably contained in the image-receiving layer in an amount of 0.1 to 30 g/m$^2$, more preferably 0.5 to 10 g/m$^2$.

The image-receiving layer may contain a water-soluble zinc salt and/or an acid.

Examples of the water-soluble zinc salts contained in the image-receiving layer include zinc chloride, zinc sulfate, zinc nitrate and zinc acetate. Preferred is zinc chloride.

Examples of the acids contained in the image-receiving layer include various organic and inorganic acids. Examples of the acids include hydrochloric acid, sulfurous acid, sulfuric acid, nitric acid, phosphoric acid, boric acid, oxalic acid, acetic acid, citric acid, tartaric acid, ascorbic acid, maleic acid, benzoic acid and toluene sulfonic acid. However, if calcium carbonate is used as a pigment (optional component of the image-receiving layer, described later), the above-mentioned inorganic acid such as hydrochloric acid or sulfuric acid reacts with the pigment, and hence the inorganic acid does not sufficiently function as the flocculating agent (agglomerating agent), sometimes resulting in little increase of the image density. The this viewpoint, water-soluble organic acids are preferred.

The water-soluble zinc salt and/or acid is preferably contained in the image-receiving layer in an amount of 3 to 300 wt. % based on the whole amount of the binder polymer.

The coating amount of the zinc salt and/or acid is preferably in the range of 0.1 to 20 g/m$^2$, more preferably 0.5 to 5 g/m$^2$.

There is no specific limitation on the developer contained in each of the above-mentioned image-receiving materials of the present invention. Representative examples of the developers are phenols, organic acids or salts thereof, and esters thereof. In the case of using a leuco dye as a color image forming substance, zinc salts of derivatives of salicylic acid are preferably employed, and particularly preferred thereamong is 3,5-di-α-methylbenzyl zinc salicylate. The particle size thereof is preferably in the range of 0.1 to 20 μm.

Details of phenols are described for example in the aforementioned Japanese Patent Provisional Publication No. 62(1987)-117794, and details of metal salts of derivatives of salicyclic acid are described for example in Japanese Patent Publication No. 52(1977)-1327. Details of oil-soluble metal salts of salicylic acids are described in U.S. Pat. Nos. 3,864,146 and 4,046,914.

The developer is preferably contained in the image-receiving layer in an amount of 0.1 to 50 g/m$^2$, more preferably 0.5 to 20 g/m$^2$.

An image-receiving layer generally means a layer having specific functions concerning formation of an image and fixing thereof. The image-receiving layer of the image receiving material of the invention contains the above-defined binder polymer (or further the specific zinc salt and/or acid), and is provided with a function of increasing an image density obtained after the transferring stage under pressure. Examples of other functions of the image-receiving layer include a function of enhancing the surface smoothness of the image-receiving material to smoothly promote the image formation after transferring, a function of enhancing the image quality such as glossiness, and functions directly concerning to the formation of an image and fixing thereof. The terms "image-receiving layer" used herein means a layer provided on the support and having one or more functions concerning to the above-described image formation.

The image-receiving layer of each of the above-mentioned image-receiving materials according to the invention can be constituted in optional form using a variety of optional components depending on the image-forming method.

Examples of the optional components to be contained in the image-receiving layer include a pigment, a thermoplastic compound, a photopolymerization initiator and a thermal polymerization initiator.

By incorporation of the pigment into the image-receiving layer, the aforementioned phase separation and agglomeration easily occur, whereby an image-receiving layer having a high void ratio can be obtained.

Examples of the pigments include inorganic pigments such as calcium carbonate, silica, aluminum silicate and zinc oxide, and polymer particles such as polyethylene, polystyrene and polymethyl methacrylate. Particle size of the pigment is preferably in the range of 0.1 to 50 μm, more preferably 0.5 to 10 μm. The pigment is preferably contained in the image-receiving layer in an amount of 0.5 to 50 g/m$^2$, more preferably 1 to 20 g/m$^2$.

The image-receiving layer may contain a thermoplastic compound. In the case that the thermoplastic compound is contained in the image-receiving layer, the image-receiving layer itself is preferably constituted in the form of cohesion of a granulated thermoplastic compound. The image-receiving layer containing the granulated thermoplastic compound can easily form a transferred image, and give a glossy image under heating after image formation. There is no specific limitation on the granulated thermoplastic compound, and any known thermoplastic resin, wax, etc. can be employed in the invention. The glass transition point of the thermoplastic resin or the melting point of wax is preferably not higher than 200° C., respectively. The thermoplastic compound preferably has a mean particle size of 0.05 to 100 μm, more preferably 0.5 to 20 μm. The thermoplastic compound is preferably contained in the image-receiving layer in an amount of 1 to 20 g/m$^2$, more preferably 0.1 to 5 g/m$^2$. The amount of the thermoplastic compound is preferably in the range of 2 to 100 wt. % based on the solid content of the image-receiving layer.

The image-receiving material having an image-receiving layer which contains the above-mentioned granulated thermoplastic compound is described in Japanese Patent Application No. 61(1986)-124952 and 61(1986)-124953.

The image-receiving layer may contain a photopolymerization initiator or a thermal polymerization initiator. By incorporating those components, fixing of the transferred image (image of unpolymerized polymerizable compound) can be easily and efficiently conducted.

The image-receiving material having an image-receiving layer which contains the thermal polymerization initiator is described in Japanese Patent Provisional Publication No. 62(1987)-210444, and the image-receiving material having an image-receiving layer which contains the photopolymerization initiator is described in Japanese Patent Application No. 62(1987)-32887.

Dyes or pigments may be contained in the image-receiving layer for the purpose of entering letters, symbols, frames or the like in the image-receiving layer, or of giving a certain color to the background of the image. Further, dyes or pigments may be also employed for the purpose of making it easy to distinguish the sides of the image-receiving material. There is no specific limitation on dyes or pigments, and those which may be used as the color image forming substance are also employable as these dyes or pigments. But in the case that these dyes or pigments may disturb the image formed on the image-receiving layer, it is preferred to make density of dyes or pigments low (e.g., reflection density of not higher than 1), or to employ dyes or pigments showing a discoloring character in time of heating or light irradiation. The image-receiving material having an image-receiving layer which contains such pigment or dye is described in Japanese Patent Provisional Publication No. 62(1987)-251741.

Further, when a white pigment such as titanium dioxide or barium sulfate is contained in the image-receiving layer, the image-receiving layer may function as a white reflection layer.

The above-mentioned dyes or pigments may be either uniformly or locally contained in the image-receiving layer. For example, when the support is composed of transparent material, the white pigments may be partially contained in the image-receiving layer to make a part of the reflection image to be transparent. Thus, information of the image which is unnecessary in the transparent image may be entered in the part of the image-receiving layer containing the white pigments as the reflection image.

The image-receiving layer can be formed on a support in various manners. Generally, the components of an image-receiving layer are dissolved, emulsified or dispersed in an adequate medium to prepare a coating solution, coating the solution on a support and drying the coated layer in the conventional manner.

The image-receiving layer may be plural layers formed by preparing plural coating solutions, each containing a component of the image-receiving layer, coating those solutions on a support in order, and drying the coated layers.

The thickness of the image-receiving layer preferably ranges from 1 to 100 μm, more preferably from 1 to 20 μm.

The void ratio (void volume) of the image-receiving layer prepared as above preferably is in the range of 3 to 70% of the solid volume of the image-receiving layer.

On the image-receiving layer can be provided a protective layer or other optional layers. An example of other optional layers is a layer consisting of granulated thermoplastic compound. In the case of providing a layer of granulated thermoplastic compound on the image-receiving layer, the formation of a transferred image can be readily made as in the case of incorporating the granulated thermoplastic compound into the image-receiving layer, and in addition an image of high glossiness can be obtained under heating after the image formation. The thermoplastic compounds which may be employed in the image-receiving layer are also employable for the layer consisting of the granulated thermoplastic compound. The image-receiving material having such layer provided on the image-receiving layer is described in Japanese Patent Provisional Publication No. 62(1987)-210460.

Examples of the support material employable for the image-receiving material of the invention include glass, paper, fine paper, coat paper, cast coated paper, baryta paper, synthetic paper, metals and analogous thereof, polyester, acetyl cellulose, cellulose ester, polyvinyl acetal, polystyrene, polycarbonate, polyethylene terephthalate, and paper laminated with resin or polymer (e.g., polyethylene).

In the case that a porous material such as paper is used as the support of the image-receiving material, the porous material preferably has such surface characteristics that a filtered maximum waviness of not less than 4 μm is observed in not more than 20 positions among 100 positions which are determined at random on a filtered waviness curve obtained according to JIS-B-0610. In order to obtain a transparent image, the support should be made of a transparent material. In this case, the transmittance of the support preferably is not less than 30%, more preferably is not less than 50%.

The image-forming method employing the image-receiving material of the invention is described below.

The image-forming method comprises the steps of imagewise exposing a light-sensitive material to light, developing the light-sensitive material, and transferring the unpolymerized polymerizable compound (including a color image-forming substance) to the aforementioned image-receiving material.

Constitution of the light-sensitive material will be described later.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149 (corresponding to U.S. Pat. No. 3,697,275). The image forming method described in Japanese Patent Provisional Publication No. 61(1986)-69062 (corresponding to U.S. Pat. No. 4,629,676 and European Patent Provisional Publication No. 0174634A2) which employs a heat development process has an advantage of simple procedures and short processing time because of the dry process. Thus, the latter method is preferred as the development process of the light-sensitive material.

Heating in the heat development process can be conducted in various known manners. A heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. The heating temperature for the development process usually ranges from 80° C. to 200° C., and preferably from 100° C. to 160° C. Various heating patterns are applicable. The heating time is usually not shorter than 1 second, and preferably from 1 second to 5 minutes, and more preferably from 5 seconds to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

As a result, the polymerizable compound within the area where the latent image of the silver halide has been formed (or the area where the latent image of the silver halide has not been formed) is polymerized.

After the development process, the light-sensitive material is pressed on the image-receiving material to transfer the unpolymerized polymerizable compound to the image-receiving material. The process for pressing can be carried out in various known manners. Since the image-receiving layer of the image-receiving material of the present invention has a relatively high void ratio, the unpolymerized polymerizable compound (including a color image forming substance) on the light-sensitive material can be transferred to the image-receiving layer with high efficiency, and thereby an image of high density can be obtained.

For accelerating the transferring of the polymerizable compound to the image-receiving material and enhancing the image density, the temperature of the pressing apparatus (e.g., pressing roller) or the light-sensitive material and/or image-receiving material can be made higher than room temperature in the transferring stage. In this case, the temperature thereof preferably is in the range of 20° to 200° C., more preferably 30° to 150° C. By heating the pressing apparatus or the light-sensitive material and/or image-receiving material, the viscosity of the polymerizable compound lowers to efficiently transfer polymerizable compound to the image-receiving material.

When the atmospheric temperature is low after the transferring of the polymerizable compound to the image-receiving material is completed, a color sometimes develops slowly. In this case, the temperature of the image-receiving material can be made higher than room temperature after transferring so as to increase the color-developing speed. By heating the image-receiving material, not only the color-developing speed increases, but also a density of the resulting image can be made higher than the case of developing a color at room temperature. The temperature for heating the image-receiving material preferably is in the range of 20° to 200° C., more preferably 30° to 150° C. The time for heating is generally in the range of 0.001 to 2,000 seconds, preferably 0.01 to 200 seconds. The image-receiving material can be heated in various methods such as a method of passing the material through heated rollers, a method of placing or transferring the material on a heated plate in contact therewith, and a method of irradiation using radiation sources (e.g., halogen lamp, tungsten lamp, infrared rays lamp and xenon lamp). Otherwise, a method of immersing the material in a heated liquid or a method of placing the material in a heated gas can be also employed.

The image-receiving material of the invention can be used for various image formation systems, such as monochromatic or color photography, printing, radiography, diagnosis (e.g., CRT photography of diagnostic device using supersonic wave), copy (e.g., computer-graphic hard copy), etc.

The light-sensitive material which can be advantageously used for the image-forming method of the invention is described below. The light-sensitive material used in the invention comprises a support and a light-sensitive layer containing silver halide, a reducing agent and an ethylenically unsaturated polymerizable compound. Thus composed material is referred hereinafter to as "light-sensitive material".

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. A silver halide grain can have a core/shell structure in which the silver iodide content in the shell is higher than that in the core. There is no specific limitation on the crystal habit of silver halide grains. For example, a tubular grain having an aspect ratio of not less than 3 can be used.

Two or more kinds of silver halide grains which differ in halogen composition, crystal habit, grain size, and/or other features from each other can be used in combination. There is also no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (June 1978), and Research Disclosure No. 17643, pp. 22–31 (December 1978). The reducing agents described in the these publications can be employed in the light-sensitive material of the present invention. Thus, "the reducing agent(s)" in the present specification means to include all of the reducing agents described in the above mentioned publications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, except that the compound has an ethylenically unsaturated group. Any known ethylenically unsaturated polymerizable compounds including monomers, oligomers and polymers can be contained in the light-sensitive layer. In the case that heat development (i.e., thermal development) is utilized for developing the light-sensitive material, a polymerizable compound having a relatively higher boiling point (e.g., 80° C. or higher) is preferably employed, because it is hardly evaporated upon heating. In the case that the light-sensitive layer contains a color image-forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

In the present invention, a compound having two or more ethylenic unsaturated groups in the molecule is more preferably used as the polymerizable compound. Further, an acrylic ester or an acrylic amide (including not only acrylamide, but also amides composed of acrylic acid and various amines) is preferably used as the polymerizable compound in the present invention.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include same materials for the preparation of the support of the image-receiving material.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

In the case that silver halide grains are contained in the oil droplets, the oil droplets containing five or more silver halide grains are preferably more than 50% by weight.

The oil droplets of the polymerizable compound are preferably prepared in the form of microcapsules. There is no specific limitation on preparation of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 μm, more preferably 1 to 25 μm, most preferably 3 to 20 μm.

In the case that silver halide grains are contained in the microcapsule, the silver halide grains are preferably arranged in the shell material of the microcapsules.

The light-sensitive layer can further contain optional components such as color image forming substance, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator and solvent of the polymerizable compound.

The details of the color image forming substance has been mentioned as a component of the image-receiving layer. The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersenitization. In addition to the sensitizing dyes, a substance which does not per se exhibit spectral sensitization effect or does not substantially absorb visible light but shows supersenitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of the image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. In the case that the light-sensitive material is heat-developed, a compound which releases a base when it is heated (generally, 80° to 200° C.) is preferably used.

Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate and 4-acetylaminomethyl propiolate.

These bases or base precursors are preferably used in an amount of not more than 50% by weight, and more preferably from 0.01 to 40% by weight, based on the total solid content of the light-sensitive layer. These bases or base precursors can be used singly or in combination.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26–28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development.

The antismudging agents employable in the light-sensitive material preferably are particles which are solid at ambient temperatures. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. The binder which may be employed in the above-mentioned image-receiving layer is also employable for the light-sensitive layer. The light-sensitive material employing a binder is described in Japanese Patent Provisional Publication No. 61(1986)-69062 (corresponding to U.S. Pat. No. 4,629,676 and European Patent Provisional Publication No. 0174634A2).

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, 9–15 (June 1978).

Examples of auxiliary layers which are optionally arranged on the light-sensitive material include a heating layer, an antistatic layer, an anticurl layer, a release layer, a cover sheet or a protective layer, a layer containing a base or base precursor and a base barrier layer.

The light-sensitive material can be prepared, for instance, by the following process.

The light-sensitive material is usually prepared by dissolving, emulsifying or dispersing each of the components of the light-sensitive layer in an adequate medium to obtain a coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The light-sensitive material of the invention can be prepared by coating and drying the coating solution on a support in the conventional manner.

The present invention is further described by the following examples without limiting the invention.

EXAMPLE 1

Preparation of Image-Receiving Material

To 123 g of water was added 2.5 g of 40% aqueous solution of sodium hexametaphosphate, and were further added 22 g of 3,5-di-α-methylbenzyl zinc salicylate and 53 g of 55% aqueous slurry of calcium carbonate, followed by coarsely dispersing in a mixer. The coarse dispersion was then finely dispersed in Dynomill dispersing device. To 40 g of the resulting dispersion were added 10 g of 8% aqueous solution of polyvinyl alcohol, 4 g of 10% aqueous solution of gelatin and 34 g of water, and the resulting mixture was made uniform. The resulting, mixture was evenly coated on an art paper having basis weight of 43 g/m$^2$ to give a layer having a wet thickness of 90 μm, and the coated layer was dried to prepare an image-receiving material (A) of the invention.

Preparation of Silver Halide Emulsion (A)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. After 5 minutes, to the resulting solution was further added 200 ml of an aqueous solution containing 4.3 g of potassium iodide at a fixed feed rate over a period of 5 minutes to give an emulsion. To the emulsion was then added 1.2 g of isobutylene/monosodium maleate copolymer.

After the emulsion was washed for desalting, 24 g of gelatin was added to the emulsion. Further, to the resulting emulsion were added 5 mg of sodium thiosulfate and 0.5 g of the following sensitizing dye (a) to chemically sensitize the emulsion at 60° C. for 15 minutes. Thus, a silver halide emulsion (A) (blue-sensitive, yield: 1,000 g) was obtained.

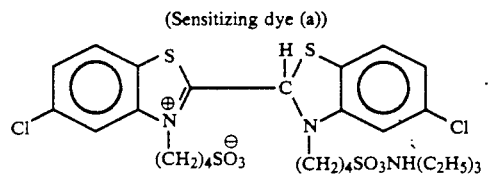

(Sensitizing dye (a))

Preparation of Silver Halide Emulsion (B)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. After 5 minutes, to the resulting solution was further added 200 ml of an aqueous solution containing 4.3 g of potassium iodide at a fixed feed rate over a period of 5 minutes to give an emulsion. To the emulsion was then added 1.2 g of isobutylene/monosodium maleate copolymer.

After the emulsion was washed for desalting, 24 g of gelatin was added to the emulsion. Further, to the resulting emulsion were added 5 mg of sodium thiosulfate and 0.47 g of the following sensitizing dye (b) to chemically sensitize the emulsion at 60° C. for 15 minutes. Thus, a silver halide emulsion (B) (green-sensitive, yield: 1,000 g) was obtained.

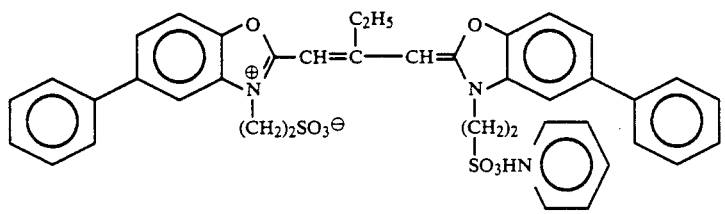

(Sensitizing dye (b))

Preparation of Silver Halide Emulsion (C)

In 1,200 ml of water were dissolved 24 g of gelatin and 1.2 g of sodium chloride, and the resulting gelatin solution was adjusted to pH 3.2 using 1N-sulfuric acid and kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. After 5 minutes, to the resulting solution was further added 200 ml of an aqueous solution containing 4.3 g of potassium iodide at a fixed feed rate over a period of 5 minutes to give an emulsion. To the emulsion was then added 1.2 g of isobutylene/monosodium maleate copolymer.

After the emulsion was washed for desalting, 24 g of gelatin was added to the emulsion. Further, to the resulting emulsion were added 5 mg of sodium thiosulfate and 0.47 g of the following sensitizing dye (c) to chemically sensityze the emulsion at 60° C. for 15 minutes. Thus, a silver halide emulsion (C) (red-sensitive, yield: 1,000 g) was obtained.

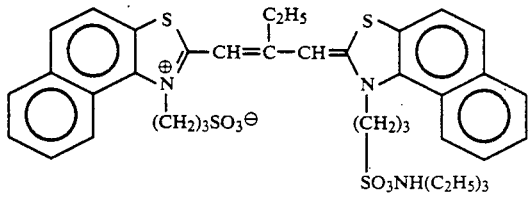

(Sensitizing dye (c))

Preparation of Light-Sensitive Composition (A)

In 50 g of the following polymerizable compound were dissolved 0.4 g of the following copolymer and 5 g of the following color image forming substance (a).

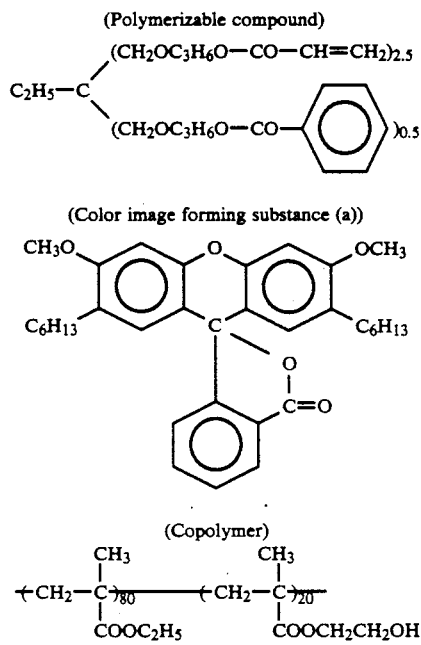

In the resulting solution were dissolved 3.9 g of the following hydrazine compound, 3.7 g of the following reducing agent, 1 g of the following surface active agent and 10 g of methylene chloride, to prepare an oily solution.

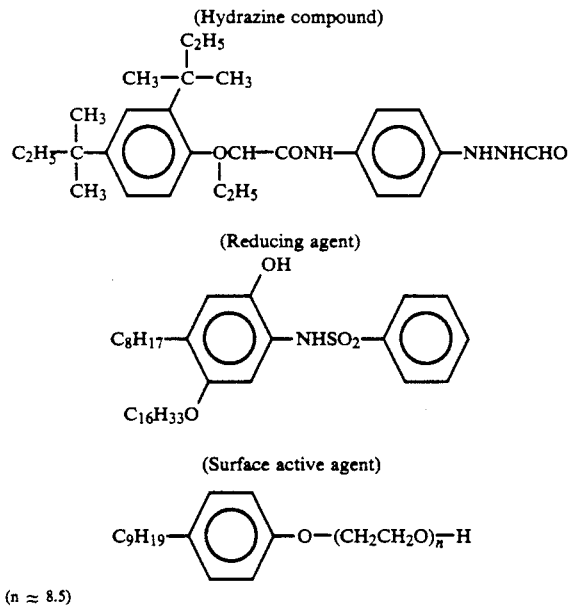

To the resulting oily solution were added 6 g of the above-obtained silver halide emulsion (A) and 1.4 g of 10% aqueous solution of potassium bromide, and the resulting mixture was stirred at 15,000 r.p.m. for 5 minutes at 40° C. using a homogenizer, to obtain a light-sensitive (blue-sensitive) composition (A).

Preparation of Light-Sensitive Composition (B)

In 50 g of the above-mentioned polymerizable compound were dissolved 0.4 g of the above-mentioned copolymer and 5 g of the following color image forming substance (b).

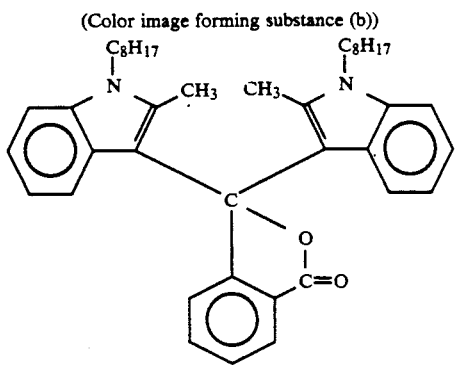

In the resulting solution were dissolved 3.9 g of the above hydrazine compound, 3.7 g of the above reducing agent, 1 g of the above surface active agent and 10 g of methylene chloride, to prepare an oily solution.

To the resulting oily solution were added 6 g of the above-obtained silver halide emulsion (B) and 1.4 g of 10% aqueous solution of potassium bromide, and the resulting mixture was stirred at 15,000 r.p.m. for 5 minutes at 40° C. using a homogenizer, to obtain a light-sensitive (green-sensitive) composition (B).

Preparation of Light-Sensitive Composition (C)

In 50 g of the above-mentioned polymerizable compound were dissolved 0.4 g of the above-mentioned copolymer and 5 g of the following color image forming substance (c).

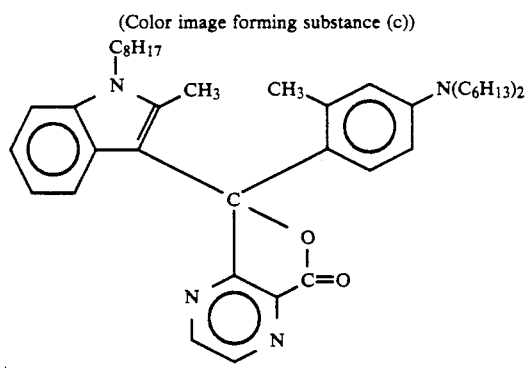

In the resulting solution were dissolved 3.9 g of the above hydrazine compound, 3.7 g of the above reducing agent, 1 g of the above surface active agent and 10 g of methylene chloride, to prepare an oily solution.

To the resulting oily solution were added 6 g of the above-obtained silver halide emulsion (C) and 1.4 g of 10% aqueous solution of potassium bromide, and the resulting mixture was stirred at 15,000 r.p.m. for 5 minutes at 40° C. using a homogenizer, to obtain a light-sensitive (red-sensitive) composition (C).

Preparation of Light-Sensitive Microcapsule Dispersion (A)

In the above-prepared light-sensitive composition (A) was dissolved 2.7 g of isocyanate compound (Takenate D110N, trade name of Takeda Chemical Industries, Ltd.). The resulting solution was added to 125 g of a 10% aqueous solution of polymer (VERSA TL-502, trade name of National Starch Co., Ltd.), and the mixture was stirred at 9,000 r.p.m. for 30 seconds at 40° C. using a homogenizer to emulsify the light-sensitive composition in the aqueous medium so as to prepare an aqueous emulsion.

Under stirring the aqueous emulsion at 1,200 r.p.m. at 25° C., the emulsion was added 36 g of a melamine-formalin prepolymer (obtained by stirring a mixture of 186 g of water, 34.5 g of melamine and 57 g of formalin at 600 r.p.m. for 30 minutes at 60° C.) and was adjusted to pH 6.0. After stirring the resulting mixture at 1,200 r.p.m. for 90 minutes at 60° C., 16 g of 40% aqueous solution of urea was added to the mixture and was adjusted to pH 3.5. The resulting dispersion was stirred at 1,000 r.p.m. for 40 minutes at 60° C., and the dispersion was adjusted to pH of 7.0. Thus, a light-sensitive (blue-sensitive) microcapsule dispersion (A) was obtained.

Preparation of Light-Sensitive Microcapsule Dispersion (B)

The above precedures for preparing a light-sensitive microcapsule dispersion (A) were repeated except for using the above-obtained light-sensitive composition (B) instead of the light-sensitive composition (A), to prepare a light-sensitive microcapsule dispersion (B).

Preparation of Light-Sensitive Microcapsule Dispersion (C)

The above precedures for preparing a light-sensitive microcapsule dispersion (A) were repeated except for using the above-obtained light-sensitive composition (C) instead of the light-sensitive composition (A), to prepare a light-sensitive microcapsule dispersion (C).

Preparation of Light-Sensitive Material

The above-prepared light-sensitive microcapsule dispersions (A), (B) and (C) (10 g each), 7 g of 10% aqueous solution of guanidine trichloroacetic acid (base precursor) and 53 g of water were mixed to prepare a coating solution for the formation of a light-sensitive layer.

The coating solution was coated on an art paper in such an amount that the dry thickness of the coated layer would be approx. 10 μm, and the coated layer was dried to obtain a light-sensitive (color-sensitive) material.

Evaluation of Image-Receiving Material

Using the above-obtained image-receiving material (A) and light-sensitive material, the following image-forming method was performed, and the the image-receiving material was evaluated in the following manner.

The light-sensitive material was imagewise exposed to light using a halogen lamp at 2,000 lux for 1 second through filter (wedge), and then heated on a hot plate at 140° C. for 5 seconds. The exposed and heated light-sensitive material was then combined with the image-receiving material and passed through press rolls under pressure of 500 kg/cm² to obtain a black positive image on the image-receiving material. The density of the obtained image was measured using a reflection densitometer.

Further, a transferring ratio of the polymerizable compound (including a color image forming substance) transferred to the image-receiving material was measured from a difference of weight of the image-receiving material between before and after the transferring and a weight of the coating amount of the light-sensitive material. The transferring ratio of the polymerizable compound corresponds to the amount of the polymerizable compound absorbed by the image-receiving material, or to the void ratio of the image-receiving layer of the image-receiving material.

The results are set forth in Table 1.

COMPARISON EXAMPLE 1

Preparation of Image-Receiving Material

The procedures for preparing an image-receiving material of Example 1 were repeated except for not using the gelatin solution and changing the amount of the aqueous solution of polyvinyl alcohol to 14 g, to prepare an image-receiving material (B) for comparison.

Evaluation of Image-Receiving Material

An image-forming method was performed in the same manner as described in Example 1, except that the image-receiving material (A) was replaced for the above-obtained image-receiving material (B), and further the image-receiving material (B) was evaluated in the same manner as described in Example 1.

The results are also set forth in Table 1.

TABLE 1

| Image-receiving Material | Maximum Density | Minimum Density | Transferring Ratio (%) |
|---|---|---|---|
| (A) | 1.20 | 0.10 | 35 |
| (B) | 1.05 | 0.10 | 30 |

As is apparent from the results in Table 1, when the image-receiving material (A) of the present invention was used in the image-forming method, the transferring ratio of the polymerizable compound was higher, and an image of higher density was obtained, as compared with the case of performing the image-forming method using the image-receiving material for comparison.

EXAMPLE 2

Preparation of Image-Receiving Material

The procedures for preparing an image-receiving material in Example 1 were repeated except for further adding 1.6 g of zinc chloride to the dispersion in the preparation of a coating solution for the formation of an image-receiving layer, to obtain an image-receiving material (C) of the invention.

Evaluation of Image-Receiving Material

Using the above-obtained image-receiving material (C) and the light-sensitive material obtained in Example 1, an image-forming method was performed in the same manner as described in Example 1. The density of the obtained visible image was measured using a reflection densitometer. Further, the transferring ratio of the polymerizable compound was also measured in the same manner as described in Example 1.

EXAMPLE 3

Preparation of Image-Receiving Material

The procedures for preparing an image-receiving material in Example 2 were repeated except for using L-ascorbic acid instead of zinc chloride in the same amount as that of zinc chloride, to obtain an image-receiving material (D) of the invention.

Evaluation of Image-Receiving Material

Using the above-obtained image-receiving material (D) and the light-sensitive material obtained in Example 1, an image-forming method was performed in the same manner as described in Example 1. The density of the obtained visible image was measured using a reflection densitometer. Further, the transferring ratio of the polymerizable compound was also measured in the same manner as described in Example 1.

COMPARISON EXAMPLE 2

Preparation of Image-Receiving Material

The procedures for preparing an image-receiving material in Example 2 were repeated except for not using gelatin solution and changing the amount of the aqueous solution of polyvinyl alcohol to 14 g, to obtain an image-receiving material (E) for comparison.

Evaluation of Image-Receiving Material

Using the above-obtained image-receiving material (E) and the light-sensitive material obtained in Example 1, an image-forming method was performed in the same manner as described in Example 1. The density of the obtained visible image was measured using a reflection densitometer. Further, the transferring ratio of the polymerizable compound was also measured in the same manner as described in Example 1.

COMPARISON EXAMPLE 3

Preparation of Image-Receiving Material

The procedures for preparing an image-receiving material in Example 2 were repeated except for not using the aqueous solution of polyvinyl alcohol and changing the amount of gelatin solution to 11.2 g, to obtain an image-receiving material (F) for comparison.

Evaluation of Image-Receiving Material

Using the above-obtained image-receiving material (F) and the light-sensitive material obtained in Example 1, an image-forming method was performed in the same manner as described in Example 1. The density of the obtained visible image was measured using a reflection densitometer. Further, the transferring ratio of the polymerizable compound was also measured in the same manner as described in Example 1.

COMPARISON EXAMPLE 4

Preparation of Image-Receiving Material

The procedures for preparing an image-receiving material in Example 2 were repeated except for using neither zinc chloride not the aqueous solution of polyvinyl alcohol and changing the amount of gelatin solution to 11.2 g, to obtain an image-receiving material (G) for comparison.

Evaluation of Image-Receiving Material

Using the above-obtained image-receiving material (G) and the light-sensitive material obtained in Example 1, an image-forming method was performed in the same manner as described in Example 1. The density of the obtained visible image was measured using a reflection densitometer. Further, the transferring ratio of the polymerizable compound was also measured in the same manner as described in Example 1.

The results obtained in Examples 2 and 3 and Comparison Examples 2 to 4 are set forth in Table 2, in which the results obtained in Comparison Example 2 are also set forth.

TABLE 2

| Image-receiving Material | Essential Component of Image-receiving Layer | Density Max. | Density Min. | Transferring Ratio (%) |
|---|---|---|---|---|
| (C) | PVA/gelatin/$ZnCl_2$ | 1.40 | 0.10 | 47 |
| (D) | PVA/gelatin/L-ascorbic acid | 1.38 | 0.10 | 48 |
| (E) | PVA/$ZnCl_2$ | 1.15 | 0.10 | 32 |
| (B) | PVA | 1.05 | 0.10 | 30 |
| (F) | Gelatin/$ZnCl_2$ | 1.05 | 0.10 | 30 |
| (G) | Gelatin | 1.00 | 0.10 | 25 |

As is apparent from the results set forth in Table 2, when the image-receiving material (C) or (D) of the invention was used in the image-forming method, the transferring ratio of the polymerizable compound was higher and an image of higher density (maximum density) was obtained, as compared with the case of performing the image-forming method using the image-receiving materials for comparison. Further, it was confirmed that the image density (maximum density) increased as the transferring ratio of the polymerizable compound (i.e., void ratio of the image-receiving layer) increased.

I claim:

1. An image-forming method which comprises the steps of:
    imagewise exposing to light a light-sensitive material comprising a support and a light-sensitive layer provided thereon which contains silver halide, a reducing agent, an ethylenically unsaturated polymerizable compound and a color image forming substance;
    simultaneously or thereafter developing the light-sensitive material; and
    pressing the light-sensitive material on an image-receiving material comprising a support and an image-receiving layer which comprises a developer and a binder polymer mixture composed of at least two kinds of water-soluble polymers which undergo phase separation in their mixed state, and one or both of a water-soluble zinc salt and an acid, said water-soluble zinc salt being selected from the group consisting of zinc chloride, zinc sulfate, zinc nitrate and zinc acetate to transfer the unpolymerized polymerizable compound to the image-receiving layer of the image-receiving material.

2. The image-forming method as claimed in claim 1, wherein at least the ethylenically unsaturated polymerizable compound and the color image forming substance of the light-sensitive layer of the light-sensitive material are contained in microcapsules.

3. The image-forming method as claimed in claim 1, wherein the developing process is carried out under heating.

4. The image-forming method as claimed in claim 1, wherein the developing process is carried out under heating at a temperature of 80° to 200° C.

5. The image-forming method as claimed in claim 1, wherein the acid is selected from the group consisting of hydrochloric acid, sulfurous acid, sulfuric acid, nitric acid, citric acid, tartaric acid, ascorbic acid, maleic acid, benzoic acid, and toluene sulfonic acid.

6. The image-forming method as claimed in claim 1, wherein one or both of the water-soluble zinc salt and the acid is contained in the image-receiving layer in an amount of 3 to 300 wt. % based on the whole amount of the binder.

* * * * *